United States Patent
Komaru et al.

(10) Patent No.: US 11,923,811 B2
(45) Date of Patent: Mar. 5, 2024

(54) HIGH-FREQUENCY POWER AMPLIFIER

(71) Applicant: Mitsubishi Electric Corporation, Tokyo (JP)

(72) Inventors: Ryota Komaru, Tokyo (JP); Masatake Hangai, Tokyo (JP); Shintaro Shinjo, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 444 days.

(21) Appl. No.: 17/374,542

(22) Filed: Jul. 13, 2021

(65) Prior Publication Data
US 2021/0344308 A1    Nov. 4, 2021

Related U.S. Application Data

(63) Continuation of application No. PCT/JP2019/006813, filed on Feb. 22, 2019.

(51) Int. Cl.
*H03F 3/191* (2006.01)
*H03F 1/52* (2006.01)
(Continued)

(52) U.S. Cl.
CPC .............. *H03F 3/193* (2013.01); *H03F 1/52* (2013.01); *H03G 1/007* (2013.01); *H04B 1/04* (2013.01);
(Continued)

(58) Field of Classification Search
CPC ....................................................... H03F 3/191
(Continued)

(56) References Cited

U.S. PATENT DOCUMENTS 4,581,592 A * 4/1986 Bennett ................. H03B 5/326
                                                        331/107 A
8,150,343 B2 * 4/2012 Ramachandra Reddy ..................
                                                        H03F 1/3247
                                                        455/107

(Continued)

FOREIGN PATENT DOCUMENTS

JP          4-16007 A       1/1992
JP      2001-274622 A      10/2001

OTHER PUBLICATIONS

Extended European Search Report for European Application No. 19916265.2, dated Dec. 20, 2021.

*Primary Examiner* — Henry Choe
(74) *Attorney, Agent, or Firm* — Birch, Stewart, Kolasch & Birch, LLP (57) ABSTRACT

A high-frequency power amplifier is configured in such a way as to include an input matching circuit, an amplifying element, an output matching circuit, a coupling circuit, a detection circuit, and an output terminal, and in such a way that either the input matching circuit or the output matching circuit has an active element, the detection circuit receives a signal outputted by the coupling circuit and outputs a control voltage into which the detection circuit converts the signal to the active element, and the active element changes the impedance of the active element in accordance with the control voltage outputted by the detection circuit, thereby changing the power of a signal outputted by either the input matching circuit having the active element or the output matching circuit having the active element, to change the power of a signal which the coupling circuit outputs to the output terminal.

8 Claims, 8 Drawing Sheets

(51) Int. Cl.
  *H03F 3/193* (2006.01)
  *H03G 1/00* (2006.01)
  *H04B 1/04* (2006.01)
  *H04B 1/18* (2006.01)

(52) U.S. Cl.
  CPC ....... *H04B 1/18* (2013.01); *H04B 2001/0408* (2013.01)

(58) Field of Classification Search
  USPC .................................................. 330/302, 305
  See application file for complete search history.

(56) References Cited

U.S. PATENT DOCUMENTS

| | | | | |
|---|---|---|---|---|
| 8,536,943 B2* | 9/2013 | Irvine | ................... | H03F 1/3247 |
| | | | | 330/296 |
| 2007/0024375 A1* | 2/2007 | Yamamoto | ................ | H03F 1/32 |
| | | | | 330/302 |
| 2012/0105147 A1 | 5/2012 | Harris et al. | | |

* cited by examiner

FIG. 14

HIGH-FREQUENCY POWER AMPLIFIER

CROSS REFERENCE TO RELATED APPLICATION

This application is a Continuation of PCT International Application No. PCT/JP2019/006813, filed on Feb. 22, 2019, which is hereby expressly incorporated by reference into the present application.

TECHNICAL FIELD

The present disclosure relates to a high-frequency power amplifier.

BACKGROUND ART

In devices that input and output a high frequency signal, such as wireless communication devices or radar devices, a high-frequency power amplifier that amplifies an inputted high frequency signal is mounted. The high-frequency power amplifier includes, for example, a field effect transistor (referred to as an "FET" hereinafter) whose source terminal is grounded, an input matching circuit, and an output matching circuit. In the high-frequency power amplifier, characteristics of output power flat over a wide band are required.

For example, Patent Literature 1 discloses, as a reception system for satellite wave receiving antennas, a low noise amplifier in which an antenna matching circuit, a voltage variable capacitance diode, a low noise amplifier, a bandpass filter, and a low noise amplifier are connected in order from an antenna terminal side, and in which an output level detector connected to an output stage drives a DC amplifier in accordance with an output level, thereby controlling the voltage variable capacitance diode.

CITATION LIST

Patent Literature

Patent Literature 1: JP, 2001-274622, A

SUMMARY OF INVENTION

Technical Problem

However, a problem with power amplifiers, such as an amplifier disclosed in Patent Literature 1, which controls a voltage variable capacitance diode by driving a DC amplifier is that the power amplifiers cannot amplify a high frequency signal following the high speed modulation of the high frequency signal.

The present disclosure is made in order to solve the above-described problem, and it is therefore an object of the present disclosure to provide a high-frequency power amplifier that has characteristics of output power flat over an operating band while amplifying a high frequency signal following the high speed modulation of the high frequency signal.

Solution to Problem

According to the present disclosure, there is provided a high-frequency power amplifier which is configured to include an input terminal, an input matching circuit, an amplifying element, an output matching circuit, a coupling circuit, a detection circuit, and an output terminal. Either the input matching circuit or the output matching circuit has an active element. The input matching circuit receives a signal from the input terminal and outputs the signal to the amplifying element. The amplifying element receives and amplifies the signal outputted by the input matching circuit, and outputs the amplified signal to the output matching circuit. The output matching circuit receives the signal outputted by the amplifying element and outputs the signal to the coupling circuit. The coupling circuit receives and divides the signal outputted by the output matching circuit into signals, and outputs the signals to the output terminal and the detection circuit, respectively. The detection circuit receives one of the signals outputted by the coupling circuit, converts the one of the signals into a voltage, and outputs the voltage to the active element as a control voltage. The active element receives the control voltage outputted by the detection circuit 150 and changes impedance of the active element in accordance with the control voltage, thereby changing power exhibited by the signal outputted by either the input matching circuit having the active element or the output matching circuit having the active element, to change power of a signal which the coupling circuit outputs to the output terminal.

Advantageous Effects of Invention

According to the present disclosure, characteristics of output power flat over an operating band are obtained while a high frequency signal is amplified following the high speed modulation of the high frequency signal.

DESCRIPTION OF EMBODIMENTS

Hereinafter, some embodiments of the present disclosure will be explained in detail with reference to the accompanying drawings.

Embodiment 1

An example of the configuration of a main part of a high-frequency power amplifier 100 according to Embodiment 1 will be explained with reference to FIGS. 1 and 2.

Figure 1:
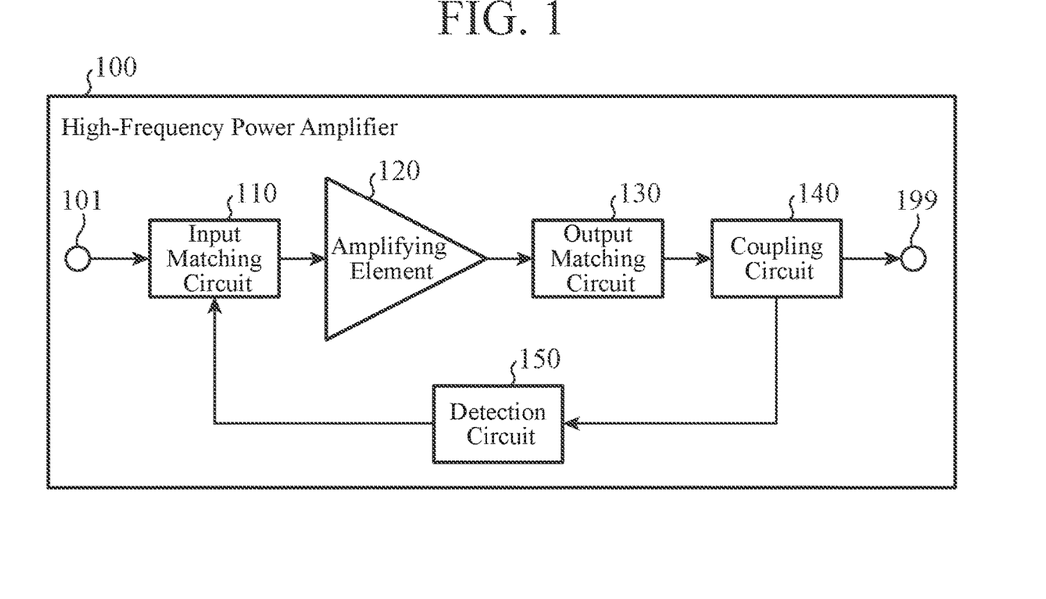
FIG. 1 is a block diagram showing an example of the configuration of a main part of a high-frequency power amplifier according to Embodiment 1.

FIG. 1 is a block diagram showing an example of the configuration of the main part of the high-frequency power amplifier 100 according to Embodiment 1.

The high-frequency power amplifier 100 includes an input terminal 101, an input matching circuit 110, an amplifying element 120, an output matching circuit 130, a coupling circuit 140, a detection circuit 150, and an output terminal 199.

The input matching circuit 110 receives a signal from the input terminal 101 and outputs this signal to the amplifying element 120. The input matching circuit 110 according to Embodiment 1 has an active element 160.

The amplifying element 120 receives the signal outputted by the input matching circuit 110, amplifies this signal, and outputs the amplified signal to the output matching circuit 130. The amplifying element 120 includes an FET such as a junction type FET or a metal-oxide-semiconductor field-effect transistor (MOSFET), having a gate terminal 121, a source terminal 123, and a drain terminal 122.

In Embodiment 1, the amplifying element 120 is configured, as an example, in such a way that the source terminal 123 thereof is grounded.

The output matching circuit 130 receives the signal outputted by the amplifying element 120 and outputs this signal to the coupling circuit 140.

The coupling circuit 140 receives the signal outputted by the output matching circuit 130, divides this signal, and outputs signals after division to the detection circuit 150 and the output terminal 199, respectively.

The detection circuit 150 receives a signal outputted by the coupling circuit 140, converts this signal into a voltage, and outputs the voltage after conversion, as a control voltage, to the active element 160.

The active element 160 receives the control voltage outputted by the detection circuit 150 and changes the impedance of the active element 160 in accordance with the control voltage. By changing the impedance of the active element 160 in accordance with the control voltage, the active element 160 changes the power exhibited by the signal outputted by the input matching circuit 110 having the active element 160, to change the power exhibited by a signal which the coupling circuit 140 outputs to the output terminal 199. More specifically, the active element 160 changes the power exhibited by the signal which the coupling circuit 140 outputs to the output terminal 199 in such a way that the power has flat output power characteristics.

Figure 2:
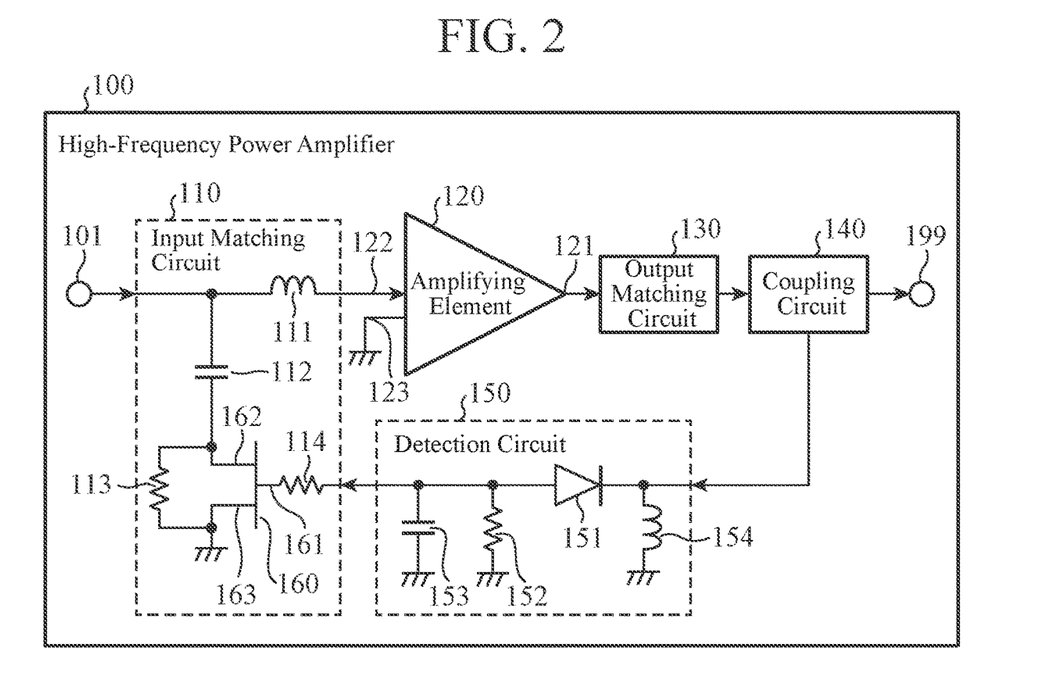
FIG. 2 is a block diagram showing an example of the configuration of a main part of an input matching circuit and a main part of a detection circuit according to Embodiment 1.

FIG. 2 is a block diagram showing an example of the configuration of a main part of the input matching circuit 110 and a main part of the detection circuit 150 according to Embodiment 1.

The active element 160 includes an FET such as a junction type FET or a MOSFET, having a gate terminal 161, a source terminal 163, and a drain terminal 162.

In Embodiment 1, an explanation will be made assuming that the active element 160 includes a junction type FET, as shown in FIG. 2.

In the active element 160, either the source terminal 163 or the drain terminal 162 of the active element 160 is grounded. In Embodiment 1, a case in which the source terminal 163 of the active element 160 is grounded will be explained as an example.

The input matching circuit 110 has a first inductor 111, a first capacitor 112, a first resistor 113, and a second resistor 114 in addition to the active element 160.

The first inductor 111 is connected in series to the input terminal 101 and the amplifying element 120. More specifically, one end of the first inductor 111 is connected to the input terminal 101 and the other end thereof is connected to the drain terminal 122 of the amplifying element 120.

One end of the first capacitor 112 is connected to the one end of the first inductor 111 and the other end thereof is connected to either the source terminal 163 or the drain terminal 162 of the active element 160 which is not grounded. In Embodiment 1, because the source terminal 163 of the active element 160 is grounded as described above, an explanation will be made assuming that the other end of the first capacitor 112 is connected to the drain terminal 162 of the active element 160.

One end of the first resistor 113 is connected to the source terminal 163 of the active element 160 and the other end thereof is connected to the drain terminal 162 of the active element 160. The first resistor 113 exhibits a resistance value larger than that exhibited by the on resistance of the active element 160 and smaller than that exhibited by the off capacitance of the active element 160.

One end of the second resistor 114 is connected to the gate terminal 161 of the active element 160 and the other end thereof is connected to the detection circuit 150. The second resistor 114 exhibits high resistance having a high resistance value.

The detection circuit 150 has a diode 151, a third resistor 152, a second capacitor 153, and a second inductor 154.

One end of the diode 151 on a cathode side is connected to the coupling circuit 140 and the other end thereof on an anode side is connected to the other end of the second resistor 114 whose one end is connected to the gate terminal 161 of the active element 160.

The third resistor 152 is shunt connected to the diode 151.

The second capacitor 153 is shunt connected to the diode 151.

The second inductor 154 is shunt connected to the diode 151.

An explanation will be made assuming that the diode 151 of the detection circuit 150 according to Embodiment 1 includes an FET, and the diode 151 performs rectification using a Schottky barrier between the gate and the source or between the gate and the drain of the FET.

The operation of the high-frequency power amplifier 100 will be explained.

Because in the detection circuit 150 the diode 151 is connected in the direction as shown in FIG. 2, the one end of the diode 151 connected to the coupling circuit 140 operates as a cathode, and the other end of the diode 151 connected to the second resistor 114 operates as an anode.

When the voltage applied to the gate terminal of the FET has a value higher than 0 volts (described as "V" hereinafter), the FET enters the on state, and the portion between the drain terminal and the source terminal in the FET (referred to as the "D-to-S portion") operates in the on resistance state which shows low resistance.

When the voltage applied to the gate terminal of the FET has a value equal to or lower than OV, the FET enters one of the following three states, for example.

The first state is the one in which the voltage applied to the gate terminal of the FET is equal to or lower than OV and is higher than a predetermined voltage. In the first state, the FET enters the on state, and the D-to-S portion operates in the on resistance state which shows low resistance.

The second state is the one in which the voltage applied to the gate terminal of the FET is equal to or lower than the above-described predetermined voltage and is higher than a pinch off voltage. In the second state, the FET enters a state between the on state and the off state, and the D-to-S portion exhibits a resistance value larger than that in the on resistance state and smaller than that when the D-to-S portion operates as off capacitance.

The third state is the one in which the voltage applied to the gate terminal of the FET is equal to or lower than the pinch off voltage. In the third state, the FET enters the off state, and the D-to-S portion operates as off capacitance and serves as high resistance.

The control voltage which the detection circuit 150 outputs to the gate terminal 161 of the active element 160 has a correlation with an output power value showing the magnitude of the power which the coupling circuit 140 outputs to the detection circuit 150. More specifically, the control voltage which the detection circuit 150 outputs to the gate terminal 161 of the active element 160 has a correlation with the power which the amplifying element 120 outputs to the coupling circuit 140.

Figure 3:
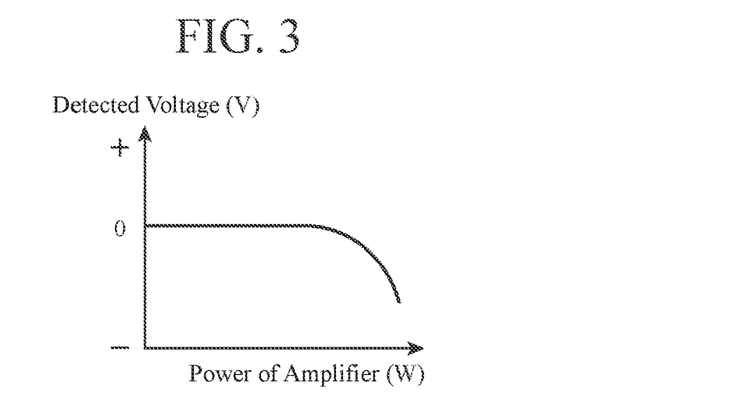
FIG. 3 is a diagram showing an example of a relation between the magnitude of power outputted by an amplifying element and the magnitude of a control voltage which the detection circuit outputs to the gate terminal of an active element according to Embodiment 1.

FIG. 3 is a diagram showing an example of a relation between the magnitude of the power outputted by the amplifying element 120 and the magnitude of the control voltage which the detection circuit 150 outputs to the gate terminal 161 of the active element 160 according to Embodiment 1.

When the magnitude of the power outputted from the amplifying element 120 is equal to or less than a predetermined threshold, the magnitude of the control voltage which the detection circuit 150 outputs to the gate terminal 161 of the active element 160 becomes OV. On the other hand, because the other end of the diode 151 connected to the second resistor 114 operates as an anode when the magnitude of the power outputted by the amplifying element 120 is greater than the predetermined threshold, the magnitude of the control voltage which the detection circuit 150 outputs to the gate terminal 161 of the active element 160 becomes a negative value. In addition, when the magnitude of the power outputted by the amplifying element 120 is greater than the predetermined threshold, the larger magnitude the power outputted by the amplifying element 120 has, the larger absolute value the negative value exhibited by the control voltage which the detection circuit 150 outputs to the gate terminal 161 of the active element 160 has.

The active element 160 enters one of the above-described three states in accordance with the control voltage which the detection circuit 150 outputs to the gate terminal 161 of the active element 160. The high-frequency power amplifier 100 performs an operation corresponding to each of the states of the active element 160.

In the following explanation, it is assumed that in the input matching circuit 110, when the active element 160 is in the on state, the first inductor 111 and the first capacitor 112 cause impedance matching for signals having a specific frequency to be established between the input matching circuit 110 and the amplifying element 120 and between the input matching circuit 110 and the detection circuits 150.

Figure 4:
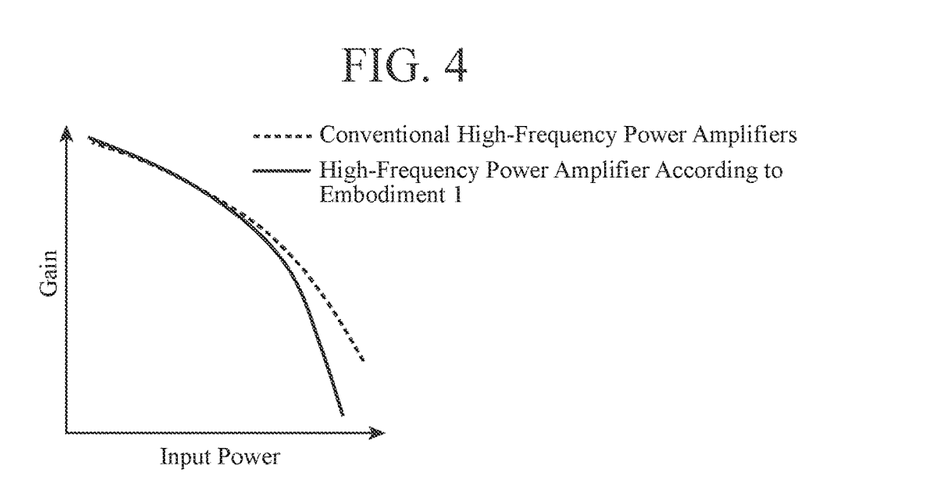
FIG. 4 is a diagram showing an example of a relation between input power showing the power of a signal which the input matching circuit receives from an input terminal and the gain of the amplifying element for this signal according to Embodiment 1.

FIG. 4 is a diagram showing an example of a relation between input power showing the power of the signal which the input matching circuit 110 receives from the input terminal 101, and the gain of the amplifying element 120 for this signal according to Embodiment 1.

When the input power shown by the power of the signal which the input matching circuit 110 receives from the input terminal 101 is small, the control voltage which the detection circuit 150 outputs to the gate terminal 161 of the active element 160 becomes equal to or lower than OV and higher than the predetermined voltage. Therefore, the active element 160 enters the on state, and the D-to-S portion of the active element 160 operates in the on resistance state which shows low resistance.

That is, when the input power showing the power of the signal which the input matching circuit 110 receives from the input terminal 101 is small, the active element 160 enters the above-described first state.

In this case, the first resistor 113 connected in parallel to the D-to-S portion does not have an influence on the input matching circuit 110. That is, the combined impedance of the input matching circuit 110 does not change in comparison with that in the state in which impedance matching is established. Therefore, because the power of the input matching circuit 110 is not consumed by the active element 160 and the first resistor 113, the power of the input matching circuit 110 is outputted to the amplifying element 120 without being consumed. As a result, the magnitude of the gain of the amplifying element 120 with respect to the magnitude of the input power becomes the same as that in conventional high-frequency power amplifiers in which the input matching circuit 110 does not have the active element 160.

When the input power showing the power of the signal which the input matching circuit 110 receives from the input terminal 101 is large, the control voltage which the detection circuit 150 outputs to the gate terminal 161 of the active element 160 becomes equal to or lower than the pinch off voltage. As a result, the active element 160 enters the off state, and the D-to-S portion of the active element 160 operates as off capacitance and serves as high resistance.

That is, when the input power showing the power of the signal which the input matching circuit 110 receives from the input terminal 101 is large, the active element 160 enters the above-described third state.

In this case, the combined impedance of the input matching circuit 110 changes by the resistance of the first resistor 113, in comparison with that in the first state. Therefore, the power of the input matching circuit 110 is consumed by the first resistor 113, and the power which the input matching circuit 110 outputs to the amplifying element 120 decreases by the power consumed by the first resistor 113. As a result, the magnitude of the gain of the amplifying element 120 with respect to the magnitude of the input power is suppressed in such a way as to become smaller compared with that in a conventional high-frequency power amplifier in which the input matching circuit 110 does not have the active element 160.

When the input power showing the power of the signal which the input matching circuit 110 receives from the input terminal 101 is of middle magnitude, the control voltage which the detection circuit 150 outputs to the gate terminal 161 of the active element 160 becomes a value equal to or lower than the above-described predetermined voltage and higher than the pinch off voltage. As a result, a state between the on state and the off state occurs, and the resistance value of the D-to-S portion of the active element 160 is larger than that exhibited by the on resistance and smaller than the resistance value exhibited by the off capacitance.

That is, when the input power showing the power of the signal which the input matching circuit 110 receives from the input terminal 101 is of middle magnitude, the active element 160 enters the above-described second state.

In this case, the combined impedance of the input matching circuit 110 changes by the combined resistance of the first resistor 113 and the resistance component of the D-to-S portion of the active element 160, in comparison with that in the first state. Therefore, when the active element 160 is in the second state, the power of the input matching circuit 110 is consumed by this combined resistance, and the power which the input matching circuit 110 outputs to the amplifying element 120 decreases by the power consumed by this combined resistance. As a result, the magnitude of the gain of the amplifying element 120 with respect to the magnitude of the input power is suppressed in such a way as to become smaller, in accordance with the power consumed by the combined resistance, compared with that in a conventional high-frequency power amplifier in which the input matching circuit 110 does not have the active element 160.

It is self-explanatory that the magnitude of the combined resistance when the active element 160 is in the second state is less than that of the combined resistance when the active element 160 is in the third state. As a result, the power consumed by the combined resistance when the active element 160 is in the second state is smaller than that consumed by the combined resistance when the active element 160 is in the third state. Therefore, the magnitude of the gain of the amplifying element 120 with respect to the magnitude of input power when the active element 160 is in the third state is smaller than the magnitude of the gain of the amplifying element 120 with respect to the magnitude of the input power when the active element 160 is in the second state.

Figure 5:
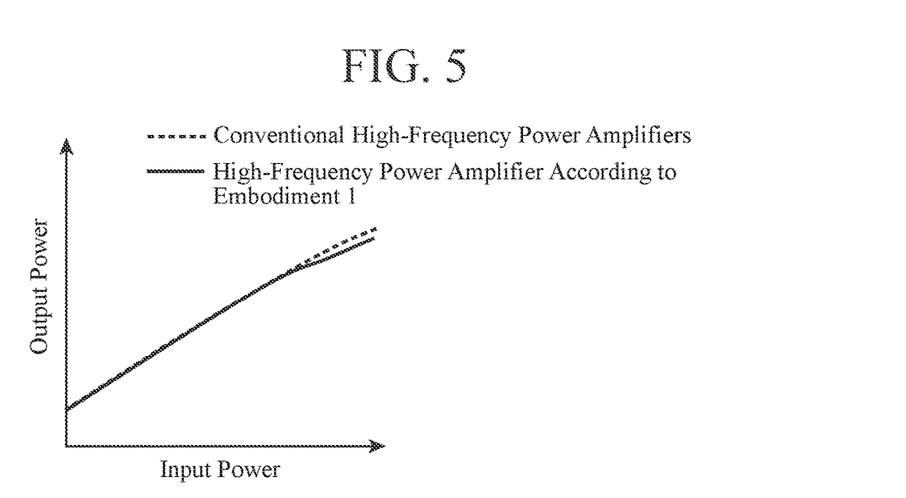
FIG. 5 is a diagram showing an example of a relation between the input power showing the power of the signal which the input matching circuit receives from the input terminal and output power showing the power of a signal which a coupling circuit outputs to an output terminal according to Embodiment 1.

FIG. 5 is a diagram showing an example of a relation between the input power showing the power of the signal which the input matching circuit 110 receives from the input terminal 101 and output power showing the power of the signal which the coupling circuit 140 outputs to the output terminal 199 according to Embodiment 1.

As explained above, in the high-frequency power amplifier 100, particularly when the absolute value of the control voltage which the detection circuit 150 outputs to the gate terminal 161 of the active element 160 is large, namely, when the power outputted from the amplifying element 120 is large, the magnitude of the gain of the amplifying element 120 with respect to the magnitude of the input power becomes small compared with that in a conventional high-frequency power amplifier in which the input matching circuit 110 does not have the active element 160. As a result, as shown in FIG. 5, in the high-frequency power amplifier 100, when the input power which the input matching circuit 110 receives from the input terminal 101 is large, the output power which the coupling circuit 140 outputs to the output terminal 199 can be suppressed to be small.

As described above, the high-frequency power amplifier 100 is configured to include the input terminal 101, the input matching circuit 110, the amplifying element 120, the output matching circuit 130, the coupling circuit 140, the detection circuit 150, and the output terminal 199, and in such a way that the input matching circuit 110 has the active element 160, the input matching circuit 110 receives a signal from the input terminal 101 and outputs this signal to the amplifying element 120, the amplifying element 120 receives the signal outputted by the input matching circuit 110, amplifies this signal, and outputs the amplified signal to the output matching circuit 130, the output matching circuit 130 receives the signal outputted by the amplifying element 120 and outputs this signal to the coupling circuit 140, the coupling circuit 140 receives the signal outputted by the output matching circuit 130, divides this signal, and outputs signals after division to the detection circuit 150 and the output terminal 199, the detection circuit 150 receives a signal outputted by the coupling circuit 140, converts this signal into a voltage, and outputs the voltage after conversion, as a control voltage, to the active element 160, and the active element 160 receives the control voltage outputted by the detection circuit 150 and changes the impedance of the active element 160 in accordance with this control voltage, thereby changing the power of the signal outputted by the input matching circuit 110 having the active element 160, to change the power of a signal which the coupling circuit 140 outputs to the output terminal 199.

By configuring the high-frequency power amplifier 100 in this way, it can provide characteristics of output power flat over an operating band while amplifying a high frequency signal, following the high speed modulation of the high frequency signal.

Further, by configuring the high-frequency power amplifier 100 in this way, it can cause the input power to be consumed by the combined resistance of the first resistor 113 and the resistance component of the D-to-S portion of the active element 160 when the input power which the input matching circuit 110 receives from the input terminal 101 is large. Therefore, the high-frequency power amplifier 100 can reduce the power which the input matching circuit 110 outputs to the amplifying element 120 by causing the input power to be consumed by the combined resistance. As a result, the high-frequency power amplifier 100 can suppress the power consumed by the amplifying element 120 when the input power which the input matching circuit 110 receives from the input terminal 101 is large.

Embodiment 2

An example of the configuration of a main part of a high-frequency power amplifier 100*a* according to Embodiment 2 will be explained with reference to FIGS. 6 and 7.

In the high-frequency power amplifier 100 according to Embodiment 1, the input matching circuit 110 has the active element 160. On the other hand, in the high-frequency power amplifier 100a according to Embodiment 2, an output matching circuit 130a, instead of the input matching circuit 110, has an active element 160.

Figure 6:
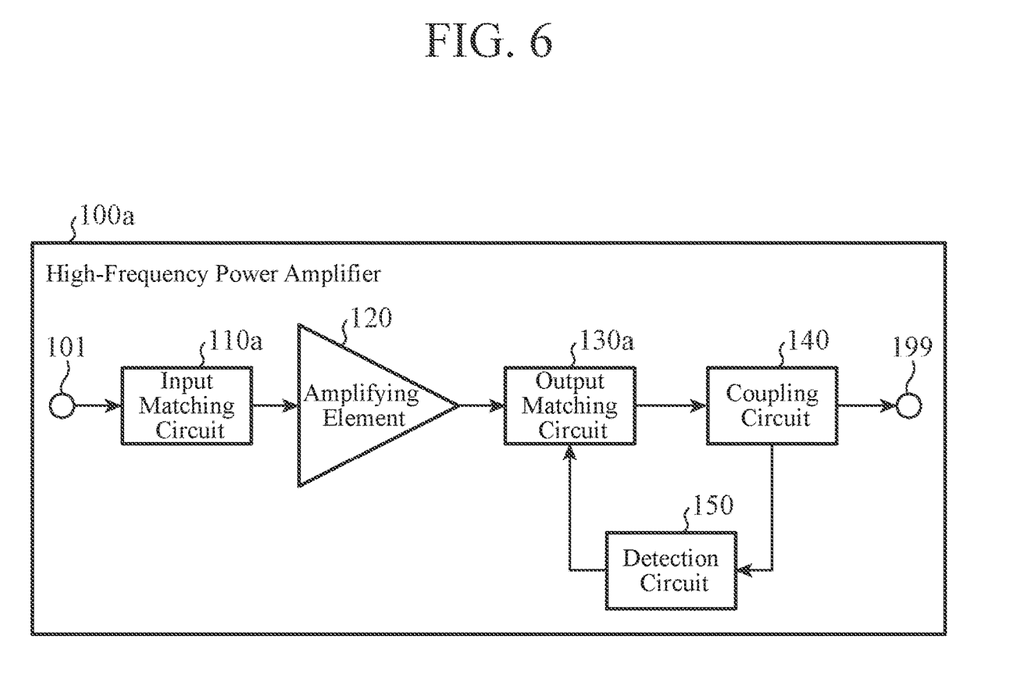
FIG. 6 is a block diagram showing an example of the configuration of a main part of a high-frequency power amplifier according to Embodiment 2.

FIG. 6 is a block diagram showing an example of the configuration of the main part of the high-frequency power amplifier 100a according to Embodiment 2.

The high-frequency power amplifier 100a includes an input terminal 101, an input matching circuit 110a, an amplifying element 120, the output matching circuit 130a, a coupling circuit 140, a detection circuit 150, and an output terminal 199.

Figure 7:
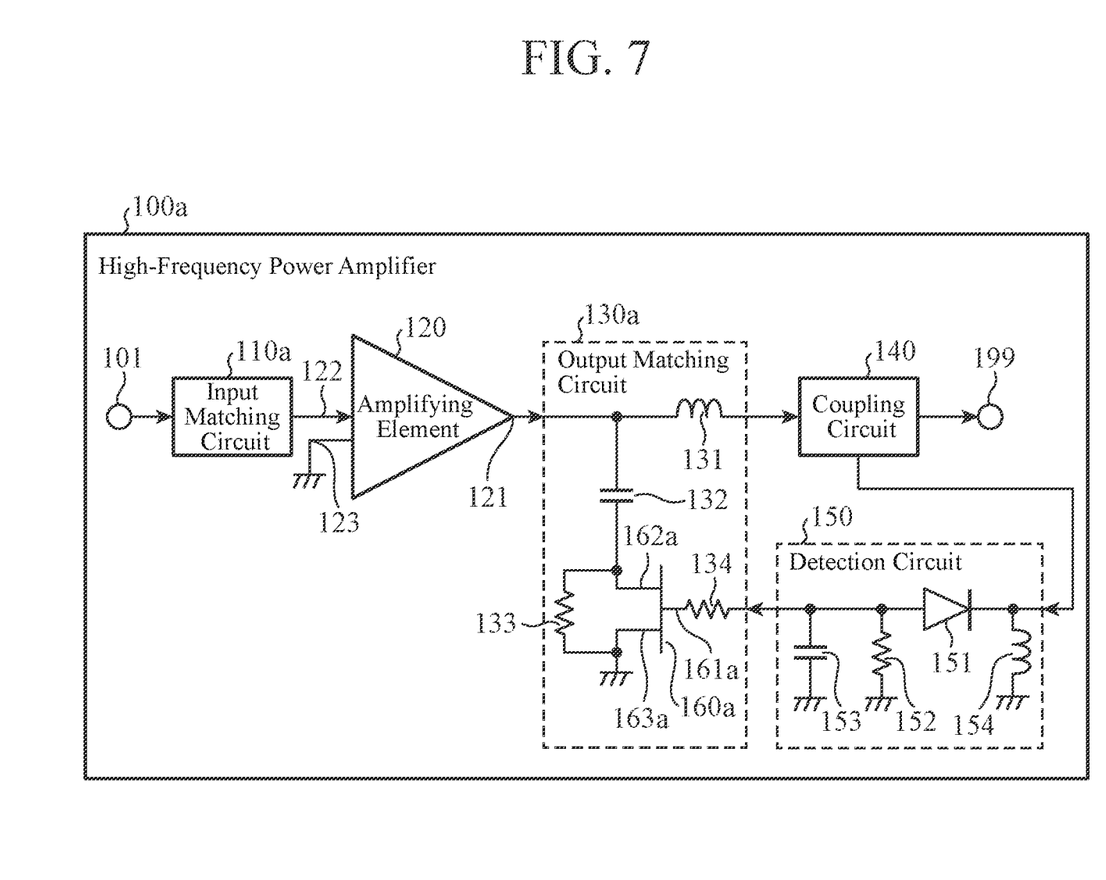
FIG. 7 is a block diagram showing an example of the configuration of a main part of an output matching circuit according to Embodiment 2.

FIG. 7 is a block diagram showing an example of the configuration of a main part of the output matching circuit 130a in the high-frequency power amplifier 100a according to Embodiment 2.

The same components as those of the high-frequency power amplifier 100 according to Embodiment 1 in the configuration of the high-frequency power amplifier 100a according to Embodiment 2 are denoted by the same reference signs, and a repetitive explanation of the components will be omitted hereinafter. Namely, an explanation of the components in FIGS. 6 and 7 which are denoted by the same reference signs as those described in FIGS. 1 and 2 will be omitted hereinafter.

The input matching circuit 110a receives a signal from the input terminal 101 and outputs this signal to the amplifying element 120. The input matching circuit 110a has a configuration in which, for example, the active element 160 and the first resistor 113 are removed from the input matching circuit 110, and the other end of the first capacitor 112 of the input matching circuit 110 is grounded.

The amplifying element 120 receives the signal outputted by the input matching circuit 110a, amplifies this signal, and outputs the amplified signal to the output matching circuit 130a. Because the amplifying element 120 according to Embodiment 2 is the same as the amplifying element 120 according to Embodiment 1, an explanation of the amplifying element will be omitted hereinafter.

The output matching circuit 130a receives the signal outputted by the amplifying element 120 and outputs this signal to the coupling circuit 140. The output matching circuit 130a according to Embodiment 2 has the active element 160.

The coupling circuit 140 receives the signal outputted by the output matching circuit 130, divides this signal, and outputs signals after division to the detection circuit 150 and the output terminal 199. Because the coupling circuit 140 according to Embodiment 2 is the same as the coupling circuit 140 according to Embodiment 1, an explanation of the coupling circuit will be omitted hereinafter.

The detection circuit 150 receives the signal outputted by the coupling circuit 140, converts this signal into a voltage, and outputs the voltage after conversion, as a control voltage, to an active element 160a. Because the detection circuit 150 according to Embodiment 2 is the same as the detection circuit 150 according to Embodiment 1, an explanation of the detection circuit will be omitted hereinafter.

The active element 160a receives the control voltage outputted by the detection circuit 150 and changes the impedance of the active element 160a in accordance with the control voltage. By changing the impedance of the active element 160a in accordance with the control voltage, the active element 160a changes the power exhibited by the signal outputted by the output matching circuit 130a having the active element 160a, to change the power exhibited by the signal which the coupling circuit 140 outputs to the output terminal 199.

The active element 160a includes an FET such as a junction type FET or a MOSFET, having a gate terminal 161a, a source terminal 163a, and a drain terminal 162a.

Because the active element 160a which the output matching circuit 130a according to Embodiment 2 has is the same as the active element 160 which the input matching circuit 110 according to Embodiment 1 has, an explanation of the active element will be omitted hereinafter.

The output matching circuit 130a has a first inductor 131, a first capacitor 132, a first resistor 133, and a second resistor 134, in addition to the active element 160a.

The first inductor 131 is connected in series to the amplifying element 120 and the coupling circuit 140. More specifically, in the case where, for example, the amplifying element 120 includes an FET, one end of the first inductor 131 is connected to a gate terminal 121 of the amplifying element 120 and the other end thereof is connected to the coupling circuit 140.

One end of the first capacitor 132 is connected to the first inductor 131 and the other end thereof is connected to one of the source and drain terminals 163a and 162a of the active element 160a. The other one which is not connected to the first inductor 131, out of the source and drain terminals 163a and 162a of the active element 160a, is grounded. Further, in Embodiment 2, an explanation will be made assuming that because the active element 160a is configured, as an example, in such a way that the source terminal 163a of the active element 160a is grounded, the other end of the first capacitor 132 is connected to the drain terminal 162a of the active element 160a.

One end of the first resistor 133 is connected to the source terminal 163a of the active element 160a and the other end thereof is connected to the drain terminal 162a of the active element 160a. The first resistor 133 exhibits a resistance value larger than that exhibited by the on resistance of the active element 160a and smaller than that exhibited by the off capacitance of the active element 160a.

One end of the second resistor 134 is connected to the gate terminal 161a of the active element 160a and the other end thereof is connected to the detection circuit 150. The second resistor 134 exhibits high resistance.

As described above, the active element 160a, the first inductor 131, the first capacitor 132, the first resistor 133, and the second resistor 134, which the output matching circuit 130a has, are the same respectively as the active element 160, the first inductor 111, the first capacitor 112, the first resistor 113, and the second resistor 114, which the input matching circuit 110 according to Embodiment 1 has.

The active element 160a enters one of three states as explained in Embodiment 1 in accordance with the control voltage which the detection circuit 150 outputs to the gate terminal 161a of the active element 160a. The high-frequency power amplifier 100 performs an operation corresponding to each of the states of the active element 160.

In the following explanation, it is assumed that in the output matching circuit 130a, when the active element 160a is in the on state, the first inductor 131 and the first capacitor 132 cause impedance matching for signals having a specific frequency to be established between the output matching circuit 130a and the coupling circuit 140 and between the output matching circuit 130a and the detection circuits 150.

Figure 8:
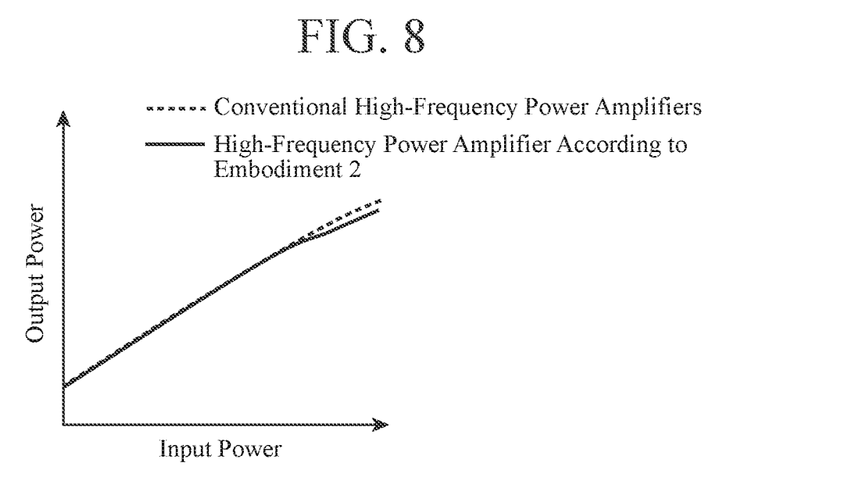
FIG. 8 is a diagram showing an example of a relation between input power showing the power of a signal which an input matching circuit receives from an input terminal and output power showing the power of a signal which a coupling circuit outputs to an output terminal according to Embodiment 2.

FIG. 8 is a diagram showing an example of a relation between input power showing the power of the signal which the input matching circuit 110a receives from the input terminal 101 and output power showing the power of the signal which the coupling circuit 140 outputs to the output terminal 199 according to Embodiment 2.

When the input power showing the power of the signal which the input matching circuit 110a receives from the input terminal 101 is small, the control voltage which the detection circuit 150 outputs to the gate terminal 161a of the active element 160a becomes equal to or lower than 0V and higher than a predetermined voltage. As a result, the active element 160a enters the on state, and a D-to-S portion of the active element 160a operates in the on resistance state which shows low resistance.

That is, when the input power showing the power of the signal which the input matching circuit 110a receives from the input terminal 101 is small, the active element 160a enters the first state as described above.

In this case, the first resistor 133 connected in parallel to the D-to-S portion does not have an influence on the output matching circuit 130a. More specifically, the combined impedance of the output matching circuit 130a does not change in comparison with that in the state in which impedance matching is established. Therefore, because the power of the output matching circuit 130a is not consumed by the active element 160a and the first resistor 133, the power of the output matching circuit 130a is outputted to the coupling circuit 140 without being consumed. As a result, the output power which the coupling circuit 140 outputs to the output terminal 199 becomes the same as that in conventional high-frequency power amplifiers in which the output matching circuit 130a does not have the active element 160a.

When the input power showing the power of the signal which the input matching circuit 110a receives from the input terminal 101 is large, the control voltage which the detection circuit 150 outputs to the gate terminal 161a of the active element 160a becomes equal to or lower than a pinch off voltage. As a result, the active element 160a enters the off state, and the D-to-S portion of the active element 160a operates as off capacitance and serves as high resistance.

That is, when the input power showing the power of the signal which the input matching circuit 110a receives from the input terminal 101 is large, the active element 160a enters the third state as described above.

In this case, the combined impedance of the output matching circuit 130a changes by the resistance of the first resistor 133, in comparison with that in the first state. Therefore, the power of the output matching circuit 130a is consumed by the first resistor 133, and the power which the output matching circuit 130a outputs to the coupling circuit 140 decreases by the power consumed by the first resistor 133. As a result, the output power which the coupling circuit 140 outputs to the output terminal 199 is suppressed to become smaller compared with that in a conventional high-frequency power amplifier in which the output matching circuit 130a does not have the active element 160a.

When the input power showing the power of the signal which the input matching circuit 110a receives from the input terminal 101 is of middle magnitude, the control voltage which the detection circuit 150 outputs to the gate terminal 161a of the active element 160a becomes a value equal to or higher than the above-described predetermined voltage and higher than the pinch off voltage. As a result, a state between the on state and the off state occurs, and the resistance value of the D-to-S portion of the active element 160a is larger than that exhibited by the on resistance and smaller than the resistance value exhibited by the off capacitance.

That is, when the input power showing the power of the signal which the input matching circuit 110a receives from the input terminal 101 is of middle magnitude, the active element 160a enters the second state as described above.

In this case, the combined impedance of the output matching circuit 130a changes by the combined resistance of the first resistor 133 and the resistance component of the D-to-S portion of the active element 160a, in comparison with that in the first state. Therefore, when the active element 160a is in the second state, the power of the output matching circuit 130a is consumed by this combined resistance, and the power which the output matching circuit 130a outputs to the coupling circuit 140 decreases by the power consumed by this combined resistance. As a result, the output power which the coupling circuit 140 outputs to the output terminal 199 is suppressed to become smaller, in accordance with the power consumed by the combined resistance, compared with that in a conventional high-frequency power amplifier in which the output matching circuit 130a does not have the active element 160a.

It is self-explanatory that the magnitude of the combined resistance when the active element 160a is in the second state is smaller than that of the combined resistance when the active element 160a is in the third state. As a result, the power consumed by the combined resistance when the active element 160a is in the second state is smaller than that consumed by the combined resistance when the active element 160a is in the third state.

As explained above, in the high-frequency power amplifier 100a, particularly when the absolute value of the control voltage which the detection circuit 150 outputs to the gate terminal 161a of the active element 160a is large, more specifically, when the input power which the input matching circuit 110a receives from the input terminal 101 is large, the output power which the coupling circuit 140 outputs to the output terminal 199 can be suppressed to be small compared with that in a conventional high-frequency power amplifier in which the output matching circuit 130a does not have the active element 160a.

As described above, the high-frequency power amplifier 100a is configured to include the input terminal 101, the input matching circuit 110a, the amplifying element 120, the output matching circuit 130a, the coupling circuit 140, the detection circuit 150, and the output terminal 199. The output matching circuit 130a has the active element 160a, the input matching circuit 110a receives a signal from the input terminal 101 and outputs this signal to the amplifying element 120, the amplifying element 120 receives the signal outputted by the input matching circuit 110a, amplifies this signal, and outputs the amplified signal to the output matching circuit 130a, the output matching circuit 130a receives the signal outputted by the amplifying element 120 and outputs this signal to the coupling circuit 140, the coupling circuit 140 receives the signal outputted by the output matching circuit 130a, divides this signal, and outputs signals after division to the detection circuit 150 and the output terminal 199, the detection circuit 150 receives a signal outputted by the coupling circuit 140, converts this signal into a voltage, and outputs the voltage after conversion, as a control voltage, to the active element 160a, and the active element 160a receives the control voltage outputted by the detection circuit 150 and changes the impedance of the active element 160a in accordance with this control voltage, thereby changing the power exhibited by the signal outputted by the input matching circuit 130a having the active element 160a, to change the power exhibited by a signal which the coupling circuit 140 outputs to the output terminal 199.

By configuring the high-frequency power amplifier 100a in this way, it can provide characteristics of output power flat over an operating band while amplifying a high frequency signal, following the high speed modulation of the high frequency signal.

Embodiment 3

An example of the configuration of a main part of a high-frequency power amplifier 100b according to Embodiment 3 will be explained with reference to FIGS. 9 and 10. The high-frequency power amplifier 100 according to Embodiment 1 is configured by connecting the coupling circuit 140 and the detection circuit 150 by a short-circuited line.

On the other hand, the high-frequency power amplifier 100b according to Embodiment 3 is configured by connecting a coupling circuit 140b and a detection circuit 150 by capacitive coupling or a coupled line.

That is, the high-frequency power amplifier 100b according to Embodiment 3 is the one in which the coupling circuit 140 according to Embodiment 1 is modified into the coupling circuit 140b.

Figure 9:
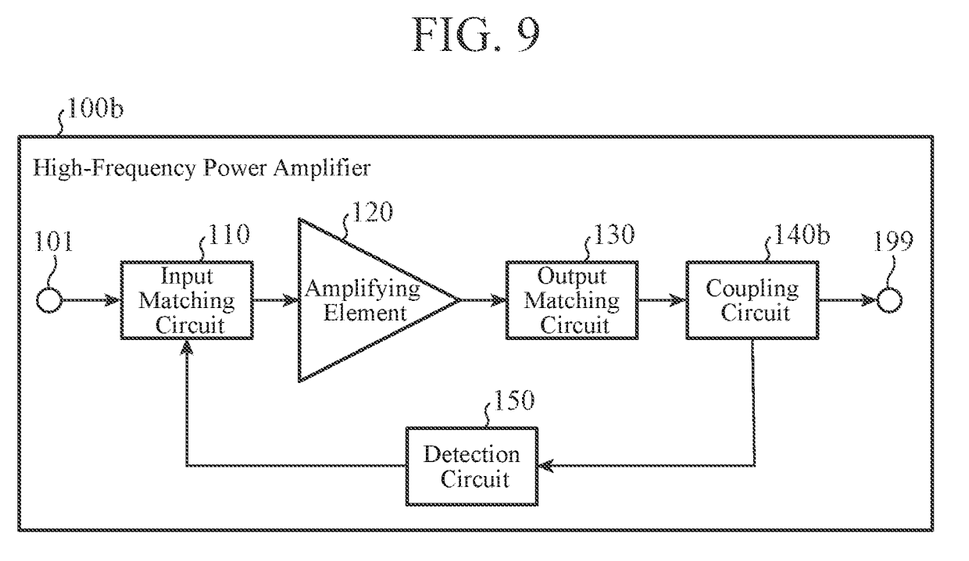
FIG. 9 is a block diagram showing an example of the configuration of a main part of a high-frequency power amplifier according to Embodiment 3.

FIG. 9 is a block diagram showing an example of the configuration of the main part of the high-frequency power amplifier 100b according to Embodiment 3.

The high-frequency power amplifier 100b shown in FIG. 9 includes an input terminal 101, an input matching circuit 110, an amplifying element 120, an output matching circuit 130, the coupling circuit 140b, the detection circuit 150, and an output terminal 199.

Figure 10A:
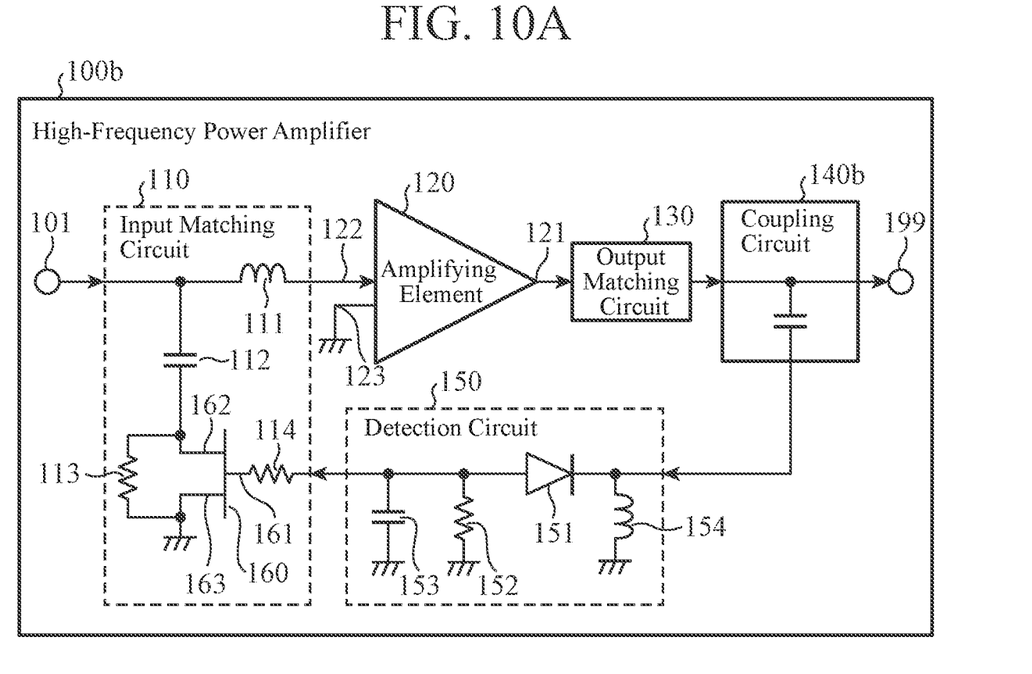
FIGS. 10A and 10B are block diagrams showing examples of the configuration of a main part of a coupling circuit according to Embodiment 3.
Figure 10B:
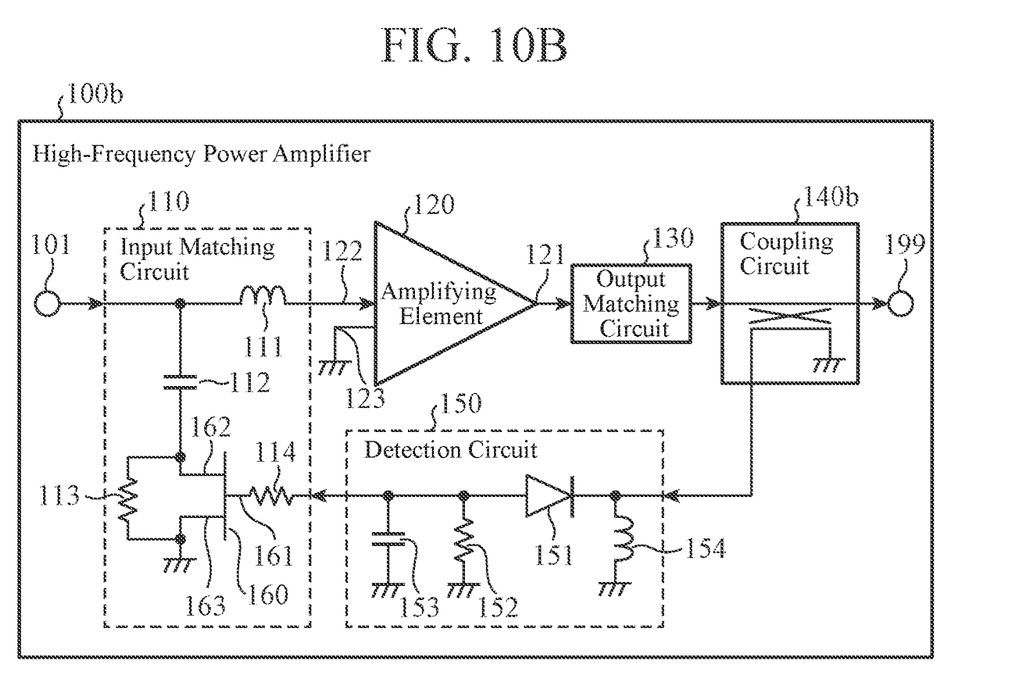

FIGS. 10A and 10B are block diagrams showing examples of the configuration of a main part of the coupling circuit 140b in the high-frequency power amplifier 100b according to Embodiment 3. Particularly, FIG. 10A shows an example of the case in which the coupling circuit 140b and the detection circuit 150 are connected by capacitive coupling, and FIG. 10B shows an example of the case in which the coupling circuit 140b and the detection circuit 150 are connected by a coupled line.

The same components in the configuration of the high-frequency power amplifier 100b according to Embodiment 3 as those of the high-frequency power amplifier 100 according to Embodiment 1 are denoted by the same reference signs, and a repetitive explanation of the components will be omitted hereinafter. That is, an explanation of the components in FIG. 9 or 10 which are denoted by the same reference signs as those described in FIG. 1 or 2 will be omitted hereinafter.

The coupling circuit 140b receives a signal outputted by the output matching circuit 130, divides this signal, and outputs signals after division to the detection circuit 150 and the output terminal 199.

The coupling circuit 140b and the detection circuit 150 are connected by capacitive coupling or a coupled line.

In the case where the coupling circuit 140b and the detection circuit 150 are connected by capacitive coupling or a coupled line, the amount of coupling between the coupling circuit 140b and the detection circuit 150 is never constant in every frequency band in the signal to be divided by the coupling circuit 140b. The amount of coupling between the coupling circuit 140b and the detection circuit 150 depends on the magnitude of the frequency of the signal to be divided by the coupling circuit 140b. That is, the amount of coupling between the coupling circuit 140b and the detection circuit 150 has frequency dependency.

Figure 11:
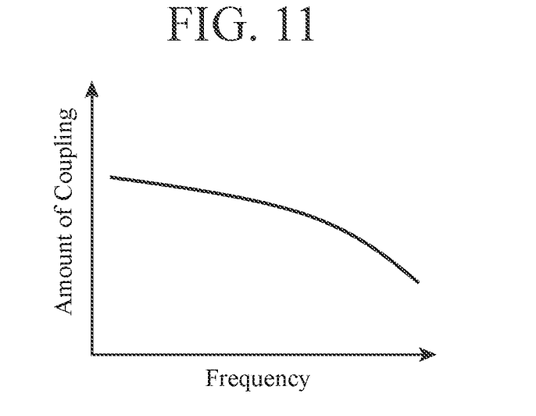
FIG. 11 is a diagram showing an example of a relation between the frequency of a signal to be divided by the coupling circuit and the amount of coupling between the coupling circuit and a detection circuit according to Embodiment 3.

FIG. 11 is a diagram showing an example of a relation between the frequency of the signal to be divided by the coupling circuit 140b and the amount of coupling between the coupling circuit 140b and the detection circuit 150 according to Embodiment 3.

The coupling circuit 140b is designed, as an example, in such a way that the amount of coupling between the coupling circuit 140b and the detection circuit 150 is larger when the frequency of the signal to be divided by the coupling circuit 140b is lower, whereas the amount of coupling is smaller when the frequency of the signal is higher, as shown in FIG. 11.

The amount of coupling between the coupling circuit 140b and the detection circuit 150 is set up as shown in FIG. 11, and, as a result, the coupling circuit 140b can increase the output sensitivity of the signal which the coupling circuit outputs to the detection circuit 150 when the signal to be divided by the coupling circuit 140b has a low frequency, whereas the coupling circuit 140b can decrease the output sensitivity of the signal which the coupling circuit outputs to the detection circuit 150 when the signal has a high frequency.

Therefore, through the setup of the amount of coupling between the coupling circuit 140b and the detection circuit 150, as shown in FIG. 11, when the power of the signal to be divided by the coupling circuit 140b is constant in every frequency band, the absolute value of the control voltage outputted by the detection circuit 150 is large in the low frequency band of the signal, whereas the absolute value is small in the high frequency band of the signal.

Figure 12:
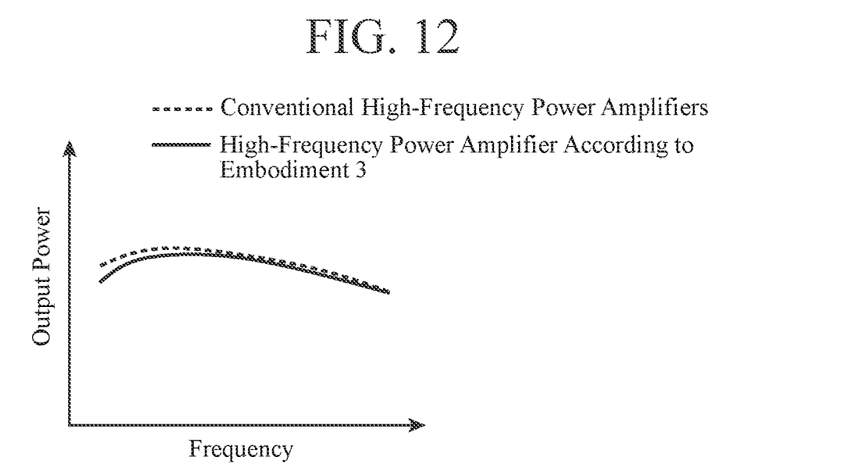
FIG. 12 is a diagram showing an example of a relation between the frequency of a signal which an input matching circuit receives from an input terminal and output power which the coupling circuit outputs to an output terminal according to Embodiment 3.

FIG. 12 is a diagram showing an example of a relation between the frequency of the signal which the input matching circuit 110 receives from the input terminal 101 and the output power which the coupling circuit 140 outputs to the output terminal 199 according to Embodiment 3. Particularly, FIG. 12 shows the case in which the amount of coupling between the coupling circuit 140b and the detection circuit 150 is set up as shown in FIG. 11, and the input power which the input matching circuit 110 receives from the input terminal 101 is constant in every frequency band.

The absolute value of the control voltage outputted by the detection circuit 150 becomes small in the high frequency band of the signal through the setup of the amount of coupling between the coupling circuit 140b and the detection circuit 150 as shown in FIG. 11. Thus, when the signal which the input matching circuit 110 receives from the input terminal 101 lies in a high frequency band, the output power which the coupling circuit 140 outputs to the output terminal 199 becomes the same as that in conventional high-frequency power amplifiers in which the input matching circuit 110 does not have the active element 160, as shown in FIG. 12.

On the other hand, the absolute value of the control voltage outputted by the detection circuit 150 becomes large in the low frequency band of the signal through the setup of the amount of coupling between the coupling circuit 140b and the detection circuit 150 as shown in FIG. 11. Thus, when the signal which the input matching circuit 110 receives from the input terminal 101 lies in a low frequency band, the output power which the coupling circuit 140 outputs to the output terminal 199 is suppressed to become smaller compared with that in a conventional high-frequency power amplifier which does not have the active element 160, as shown in FIG. 12.

As described above, by connecting the coupling circuit 140*b* and the detection circuit 150 using capacitive coupling or a coupled line, and setting up the amount of coupling between the coupling circuit 140*b* and the detection circuit 150 in such a way that the amount of coupling is larger in a frequency band in which the high-frequency power amplifier 100*b* outputs excessive power, whereas the amount of coupling is smaller in frequency bands other than the frequency band, the high-frequency power amplifier 100*b* can make the output power in an operating band flatter compared with that in a conventional high-frequency power amplifier which does not have the active element 160.

Figure 13:
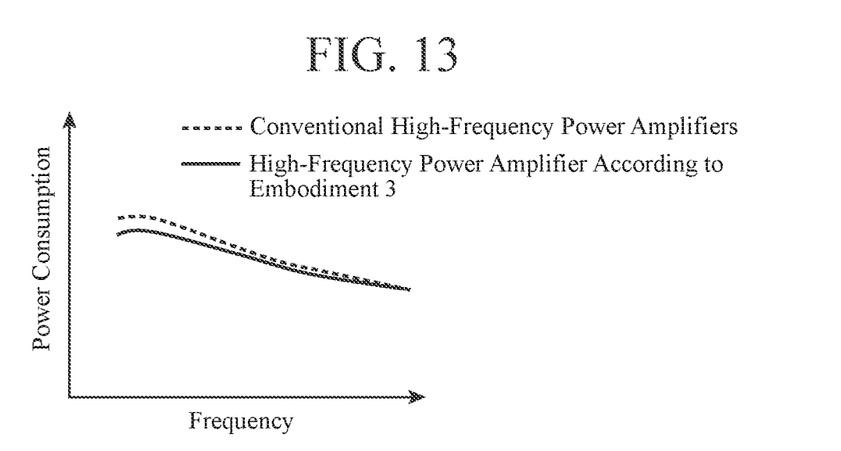
FIG. 13 is a diagram showing an example of a relation between the frequency of the signal which the input matching circuit receives from the input terminal and power consumed by an amplifying element according to Embodiment 3.

FIG. 13 is a diagram showing an example of a relation between the frequency of the signal which the input matching circuit 110 receives from the input terminal 101 and the power consumed by the amplifying element 120 according to Embodiment 3. Particularly, FIG. 13 shows the case in which the amount of coupling between the coupling circuit 140*b* and the detection circuit 150 is set up as shown in FIG. 11, and the input power which the input matching circuit 110 receives from the input terminal 101 is constant in every frequency band.

By connecting the coupling circuit 140*b* and the detection circuit 150 using capacitive coupling or a coupled line, and setting up the amount of coupling between the coupling circuit 140*b* and the detection circuit 150 in such a way that the amount of coupling is larger in a frequency band in which the high-frequency power amplifier 100*b* outputs excessive power, whereas the amount of coupling is smaller in frequency bands other than the frequency band, the high-frequency power amplifier 100*b* can cause the power, as to signals in the frequency band in which the high-frequency power amplifier outputs excessive power in the signal which the input matching circuit 110 receives from the input terminal 101, to be consumed by the combined resistance of the first resistor 113 and the resistance component of a D-to-S portion of the active element 160. Therefore, by causing the input power to be consumed by the combined resistance, the high-frequency power amplifier 100*b* can reduce the power of the signal in the frequency band which the input matching circuit 110 outputs to the amplifying element 120.

As a result, the high-frequency power amplifier 100*b* can flatten the output power in the operating band.

Variant of Embodiment 3

Figure 14:
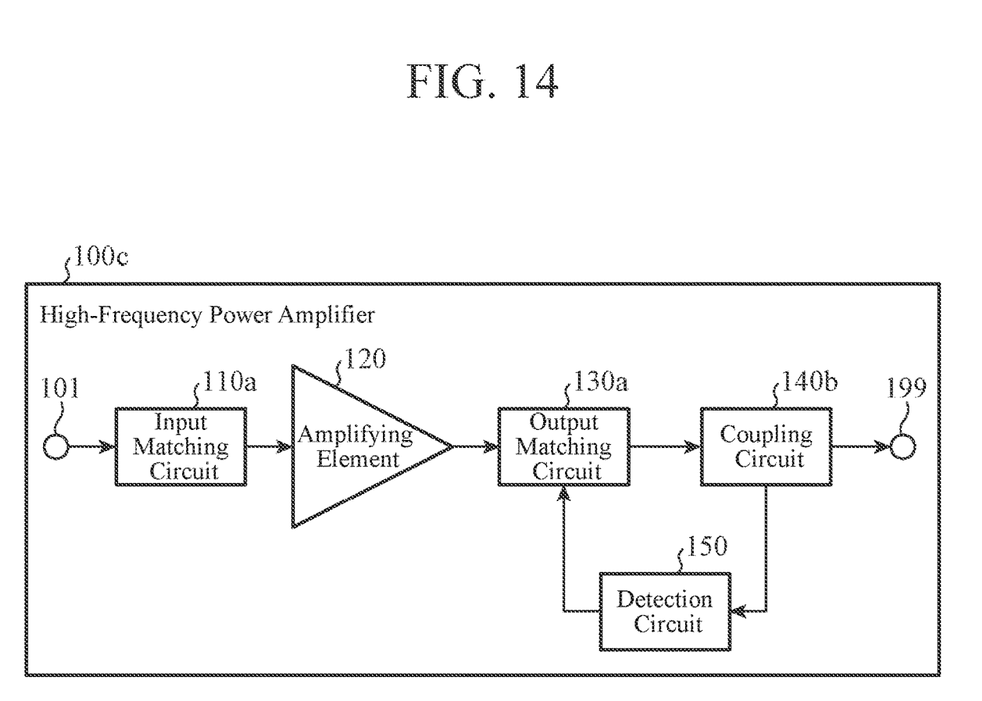
FIG. 14 is a block diagram showing an example of the configuration of a main part of a high-frequency power amplifier according to a variant of Embodiment 3.

Referring to FIG. 14, a high-frequency power amplifier 100*c* according to a variant of Embodiment 3 will be explained. Although as the high-frequency power amplifier 100*b* according to Embodiment 3 the example in which the coupling circuit 140 according to Embodiment 1 is modified into the coupling circuit 140*b* is shown, the coupling circuit 140 according to Embodiment 2 may be modified into the coupling circuit 140*b* in such a way that the high-frequency power amplifier 100*c* according to the variant of Embodiment 3 is provided, as shown in FIG. 14.

FIG. 14 is a block diagram showing an example of the configuration of a main part of the high-frequency power amplifier 100*c* according to the variant of Embodiment 3.

The high-frequency power amplifier 100*c* shown in FIG. 14 includes an input terminal 101, an input matching circuit 110*a*, an amplifying element 120, an output matching circuit 130*a*, the coupling circuit 140*b*, a detection circuit 150, and an output terminal 199.

Because the input terminal 101, the input matching circuit 110*a*, the amplifying element 120, the output matching circuit 130*a*, the coupling circuit 140*b*, the detection circuit 150, and the output terminal 199 are already explained in the above embodiments, an explanation of the components will be omitted hereinafter.

It is to be understood that an arbitrary combination of two or more of the above-described embodiments can be made, various changes can be made in an arbitrary component according to any one of the above-described embodiments, or an arbitrary component according to any one of the above-described embodiments can be omitted within the scope of the present disclosure.

INDUSTRIAL APPLICABILITY

The high-frequency power amplifier according to the present disclosure can be applied to high frequency circuits.

REFERENCE SIGNS LIST

100, 100*a*, 100*b*, and 100*c* high-frequency power amplifier, 101 input terminal, 110 and 110*a* input matching circuit, 111 first inductor, 112 first capacitor, 113 first resistor, 114 second resistor, 120 amplifying element, 121 gate terminal of amplifying element, 122 drain terminal of amplifying element, 123 source terminal of amplifying element, 130 and 130*a* output matching circuit, 131 first inductor, 132 first capacitor, 133 first resistor, 134 second resistor, 140 and 140*b* coupling circuit, 150 detection circuit, 151 diode, 152 third resistor, 153 second capacitor, 154 second inductor, 160 and 160*a* active element, 161 and 161*a* gate terminal of active element, 162 and 162*a* drain terminal of active element, 163 and 163*a* source terminal of active element, and 199 output terminal.

The invention claimed is:

1. A high-frequency power amplifier including an input terminal, an input matching circuit, an amplifying element, an output matching circuit, a coupling circuit, a detection circuit, and an output terminal, wherein
   either the input matching circuit or the output matching circuit has an active element,
   the input matching circuit receives a signal from the input terminal and outputs the signal to the amplifying element,
   the amplifying element receives and amplifies the signal outputted by the input matching circuit, and outputs the amplified signal to the output matching circuit,
   the output matching circuit receives the signal outputted by the amplifying element and outputs the signal to the coupling circuit,
   the coupling circuit receives and divides the signal outputted by the output matching circuit into signals, and outputs the signals to the detection circuit and the output terminal, respectively,
   the detection circuit receives one of the signals outputted by the coupling circuit, converts the one of the signals into a voltage, and outputs the voltage to the active element as a control voltage,
   and the active element receives the control voltage outputted by the detection circuit and changes impedance of the active element in accordance with the control voltage, thereby changing power exhibited by the signal outputted by either the input matching circuit having the active element or the output matching circuit having the active element, to change power of a signal which the coupling circuit outputs to the output terminal.

2. The high-frequency power amplifier according to claim 1, wherein the active element is a transistor having a gate terminal, a source terminal, and a drain terminal and
either the source terminal or the drain terminal of the active element is grounded, and wherein
in a case where the input matching circuit has the active element,
the input matching circuit has
a first inductor connected in series to the input terminal and the amplifying element,
a first capacitor whose one end is connected to the first inductor and whose other end is connected to either the source terminal or the drain terminal of the active element which is not grounded,
a first resistor whose one end is connected to the source terminal of the active element and whose other end is connected to the drain terminal of the active element, and
a second resistor which has high resistance and whose one end is connected to the gate terminal of the active element and whose other end is connected to the detection circuit, and
in a case where the output matching circuit has the active element,
the output matching circuit has
a first inductor connected in series to the amplifying element and the coupling circuit,
a first capacitor whose one end is connected to the first inductor and whose other end is connected to either the source terminal or the drain terminal of the active element which is not grounded,
a first resistor whose one end is connected to the source terminal of the active element and whose other end is connected to the drain terminal of the active element, and
a second resistor which has high resistance and whose one end is connected to the gate terminal of the active element and whose other end is connected to the detection circuit.

3. The high-frequency power amplifier according to claim 2, wherein the detection circuit has a diode whose one end on a cathode side is connected to the coupling circuit and whose other end on an anode side is connected to the other end of the second resistor whose one end is connected to the gate terminal of the active element,
a third resistor shunt connected to either the one end or the other end of the diode,
a second capacitor shunt connected to either the one end or the other end of the diode, and
a second inductor shunt connected to either the one end or the other end of the diode.

4. The high-frequency power amplifier according to claim 1, wherein the active element is a transistor having a gate terminal, and wherein
either the input matching circuit having the active element or the output matching circuit having the active element has a second resistor which has high resistance and whose one end is connected to the gate terminal of the active element and whose other end is connected to the detection circuit, and
the detection circuit has
a diode whose one end on a cathode side is connected to the coupling circuit and whose other end on an anode side is connected to the other end of the second resistor whose one end is connected to the gate terminal of the active element,
a third resistor shunt connected to the diode,
a second capacitor shunt connected to the diode, and
a second inductor shunt connected to the diode.

5. The high-frequency power amplifier according to claim 1, wherein the coupling circuit and the detection circuit are connected by either capacitive coupling or a coupled line.

6. The high-frequency power amplifier according to claim 2, wherein the coupling circuit and the detection circuit are connected by either capacitive coupling or a coupled line.

7. The high-frequency power amplifier according to claim 3, wherein the coupling circuit and the detection circuit are connected by either capacitive coupling or a coupled line.

8. The high-frequency power amplifier according to claim 4, wherein the coupling circuit and the detection circuit are connected by either capacitive coupling or a coupled line.

* * * * *